United States Patent
Park et al.

(10) Patent No.: US 11,447,889 B2
(45) Date of Patent: Sep. 20, 2022

(54) ADHESIVE LAYER OF SEED CRYSTAL, METHOD FOR PREPARING A LAMINATE USING THE SAME, AND METHOD FOR PREPARING A WAFER

(71) Applicant: SENIC INC., Cheonan-si (KR)

(72) Inventors: Jong Hwi Park, Suwon-si (KR); Jongmin Shim, Hwaseong-si (KR); Eun Su Yang, Suwon-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 150 days.

(21) Appl. No.: 16/915,710

(22) Filed: Jun. 29, 2020

(65) Prior Publication Data
US 2021/0115587 A1    Apr. 22, 2021

(30) Foreign Application Priority Data
Oct. 22, 2019    (KR) .......................... 10-2019-0131542

(51) Int. Cl.
*C30B 23/02*    (2006.01)
*C30B 29/36*    (2006.01)
*C09J 7/30*    (2018.01)
*C30B 23/00*    (2006.01)

(52) U.S. Cl.
CPC .............. *C30B 23/002* (2013.01); *C09J 7/30* (2018.01)

(58) Field of Classification Search
None
See application file for complete search history.

(56) References Cited

U.S. PATENT DOCUMENTS

| | | | |
|---|---|---|---|
| 4,911,983 A * | 3/1990 | Otani | H01B 1/24 428/408 |
| 2003/0047177 A1 | 3/2003 | Christ et al. | |
| 2007/0209580 A1 | 9/2007 | Kondo et al. | |

FOREIGN PATENT DOCUMENTS

| | | |
|---|---|---|
| JP | 2011-006302 A | 1/2011 |
| JP | 1993-301781 A | 11/2013 |
| JP | 2015-117143 A | 6/2015 |
| JP | 2016-124777 A | 7/2016 |
| JP | 2016-127051 A | 7/2016 |
| KR | 10-1392639 B1 | 5/2014 |
| KR | 10-2015-0075220 A | 7/2015 |
| KR | 10-2017-0103601 A | 9/2017 |
| KR | 10-2019-0062885 A | 6/2019 |
| KR | 10-1997708 B1 | 7/2019 |

OTHER PUBLICATIONS

Korean Notice of Allowance dated Jun. 15, 2021 in counterpart Korean Patent Application No. 10-2019-0131542 (2 pages in English and 5 pages in Korean).

* cited by examiner

*Primary Examiner* — Sheeba Ahmed
(74) *Attorney, Agent, or Firm* — NSIP Law

(57) ABSTRACT

An adhesive layer of seed crystal includes a graphitized adhesive layer, wherein the graphitized adhesive layer is prepared by heat-treating a pre-carbonized adhesive layer, and wherein the adhesive layer has Vr value of 28%/mm³ or more, and the Vr value is represented by Equation 1 below:

$$Vr = \left\{\frac{Sq}{(V1-V2)}\right\} \times 10^3 \quad \text{[Equation 1]}$$

where Sg (%) is represented by Equation 2 below, V1 is a volume (mm³) of the pre-carbonized adhesive layer, and V2 is a volume (mm³) of the graphitized adhesive layer, $$Sg = \left\{1 - \left(\frac{A2}{A1}\right)\right\} \times 100\% \quad \text{[Equation 2]}$$

where A1 is an area (mm²) of the pre-carbonized adhesive layer, and A2 is an area (mm²) of the graphitized adhesive layer.

8 Claims, 8 Drawing Sheets

[FIG. 1]
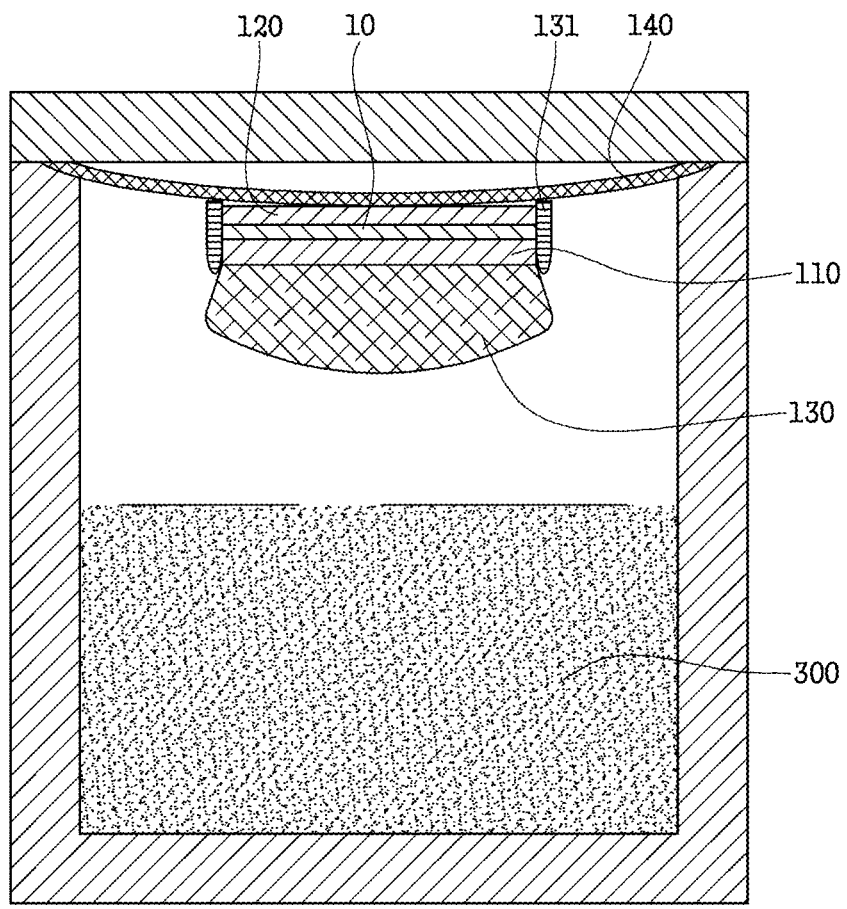

[FIG. 2A]
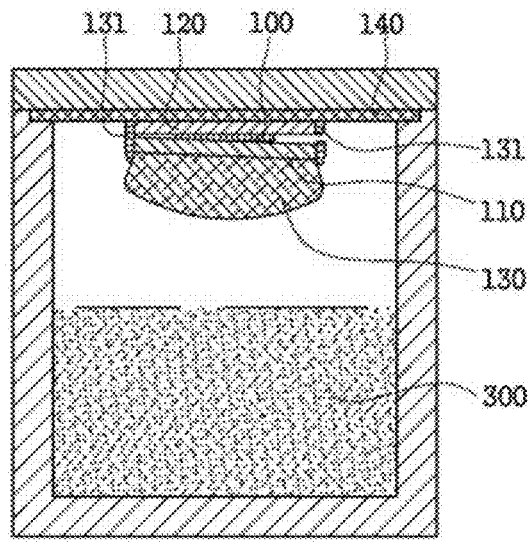
[FIG. 2B]
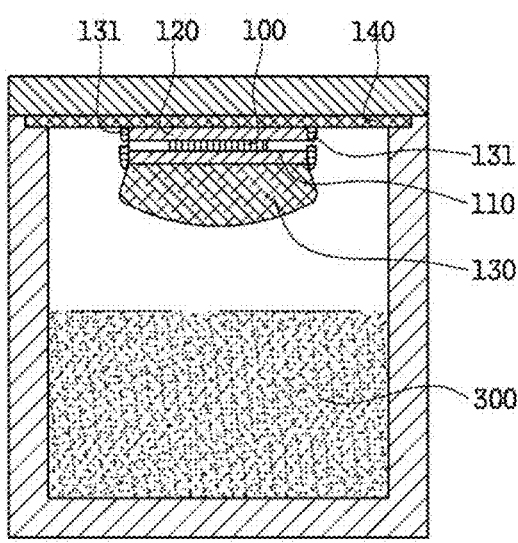

[FIG. 3]
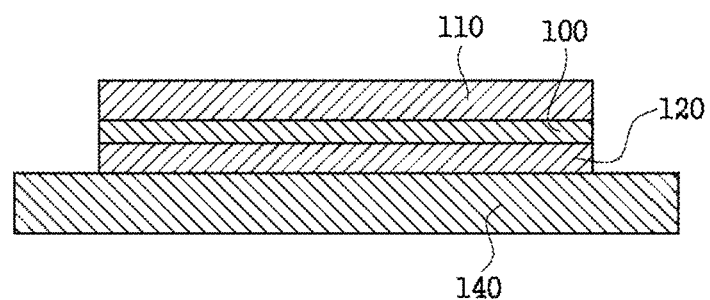

[FIG. 4]
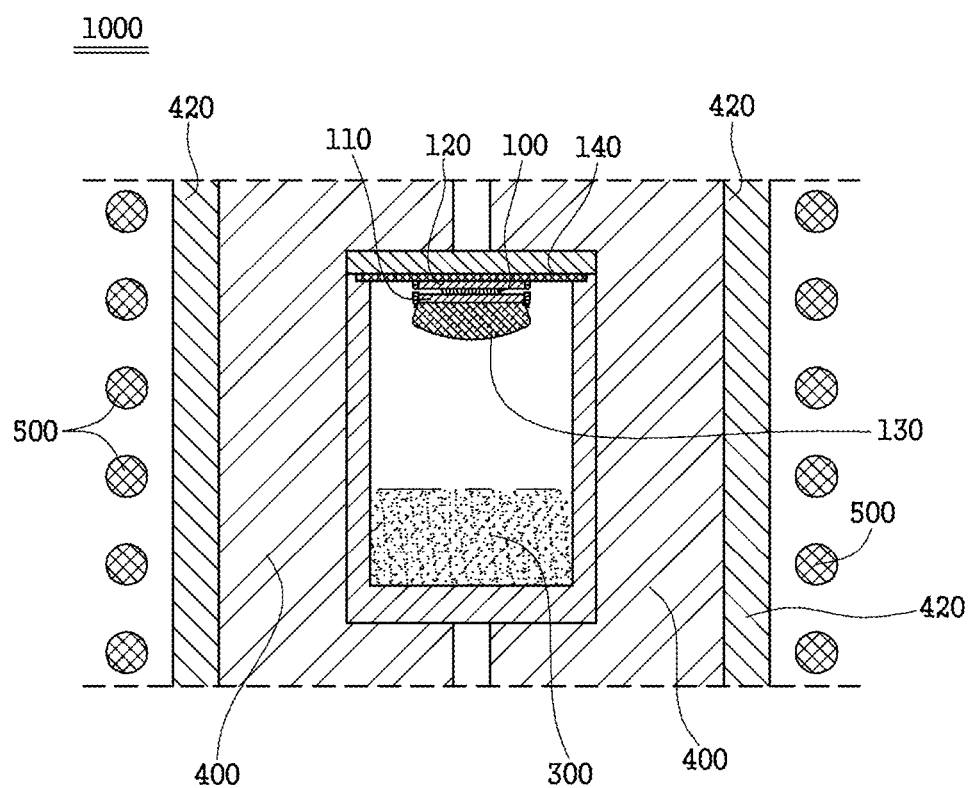

[FIG. 5]
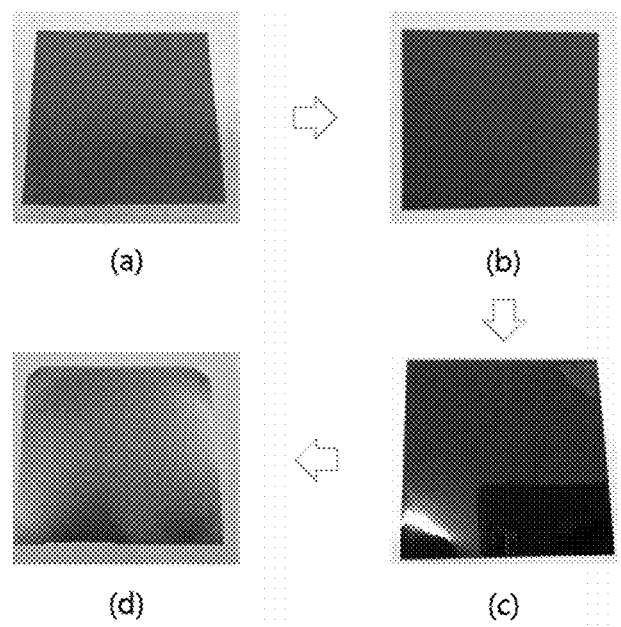

[FIG. 6A]
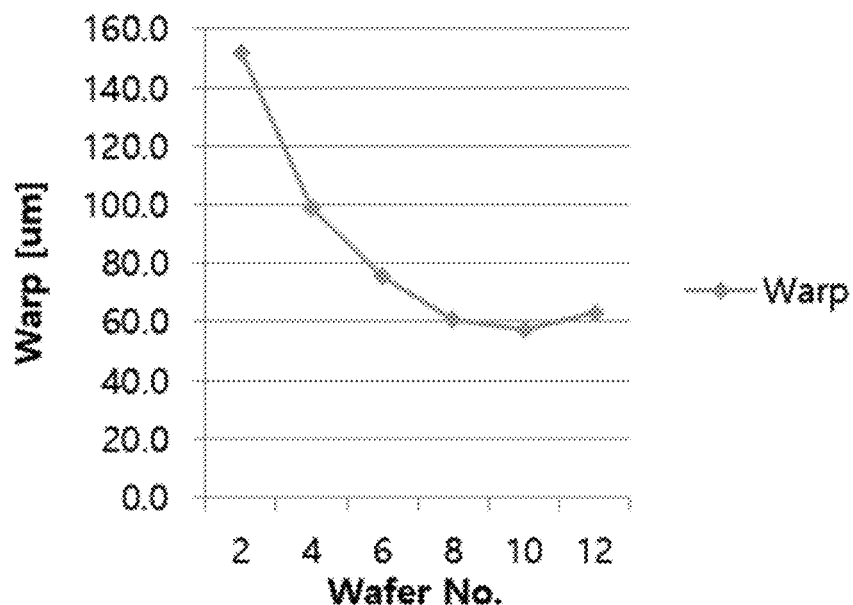
[FIG. 6B]
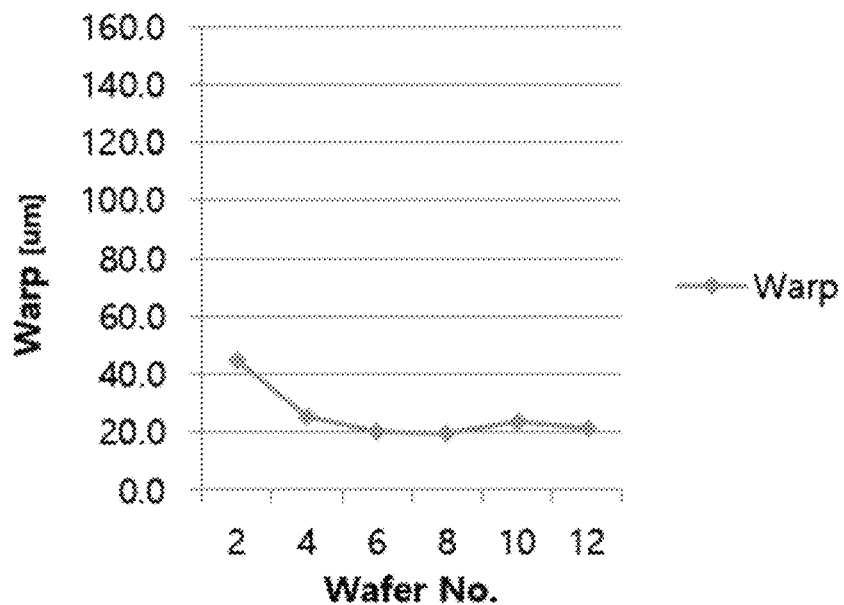

[FIG. 7A]
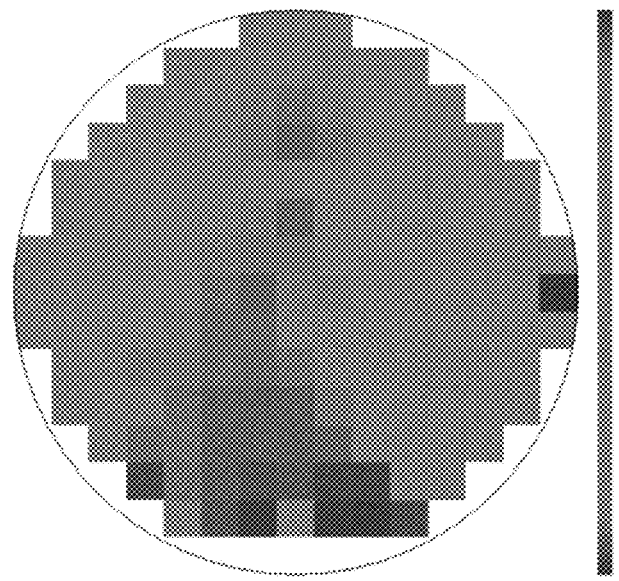
[FIG. 7B]
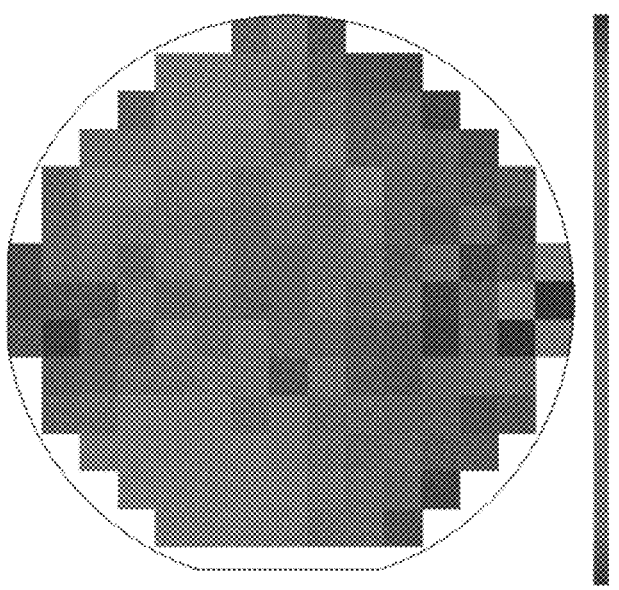

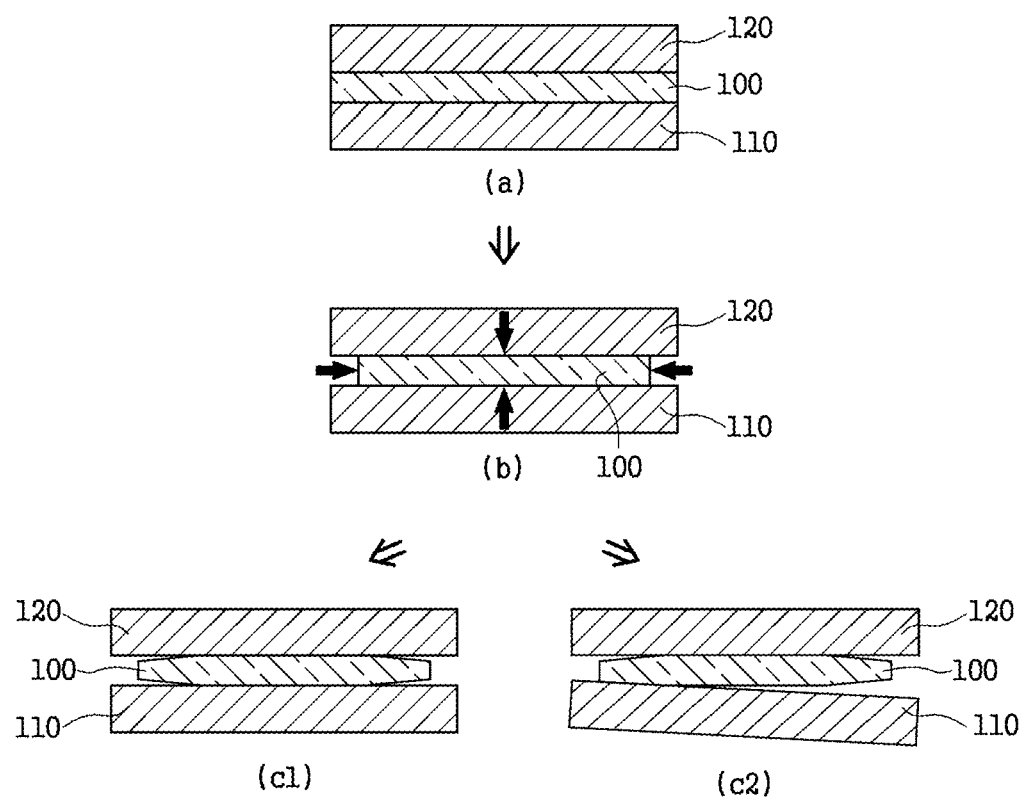
[FIG. 8]

ADHESIVE LAYER OF SEED CRYSTAL, METHOD FOR PREPARING A LAMINATE USING THE SAME, AND METHOD FOR PREPARING A WAFER

CROSS-REFERENCE TO RELATED APPLICATIONS

This application claims the benefit under 35 U.S.C. 119(a) of Korean Patent Application No. 10-2019-0131542 filed on Oct. 22, 2019, in the Korean Intellectual Property Office, the entire disclosure of which is incorporated herein by reference for all purposes.

BACKGROUND

1. Field

The present disclosure relates to adhesive layer of seed crystal, method for preparing a laminate using the same, and method for preparing a wafer.

2. Description of the Background

Silicon carbide (SIC) is a semiconductor with a wide band gap of 2.2 eV to 3.3 eV, and research and development has been progressing due to its excellent physical and chemical characteristics as a semiconductor material.

As methods for preparing a SIC single crystal, there are Liquid Phase Epitaxy (LPE), Chemical Vapor Deposition (CVD), Physical Vapor Transport (PVT), and the like. Among them, the PVT is a method of growing a SIC single crystal as follows: loads SIC raw materials into a crucible, places a seed crystal composed of a SIC single crystal on the top of the crucible, and then heats the crucible by an induction heating method to sublimate the raw materials such that the SIC single crystal grows on the seed crystal. PVT is the most widely used process for a preparation of a SIC in the form of an ingot at high growth rate.

Meanwhile, in order to grow a SIC single crystal, an adhesive layer formed between a seed crystal and a seed crystal holder has been used. However, during the growth of a SIC single crystal ingot, due to a difference in coefficient of thermal expansion between the seed crystal holder and the adhesive layer, stress may be applied to the ingot, and a warp value may increase during wafer processing, or the crystal quality may decrease.

Methods for producing a SIC may include "Method for growing single crystal silicon carbide" disclosed in Korean Patent Publication No. 10-2015-0075220, and "Manufacturing method for silicon carbide monocrystals" disclosed in Korean Patent Registration No. 10-1392639 and etc.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an adhesive layer comprising a graphitized adhesive layer is provided, wherein the graphitized adhesive layer is prepared by heat-treating a pre-carbonized adhesive layer, and wherein the adhesive layer has Vr value of 28%/mm³ or more, and the Vr value is represented by Equation 1 below:

$$Vr = \left\{\frac{Sg}{(V1-V2)}\right\} \times 10^3 \quad \text{[Equation 1]}$$

where Sg (%) is represented by Equation 2 below, V1 is a volume (mm³) of the pre-carbonized adhesive layer and V2 is a volume (mm³) of the graphitized adhesive layer, $$Sg = \left\{1 - \left(\frac{A2}{A1}\right)\right\} \times 100\% \quad \text{[Equation 2]}$$

where A1 is an area (mm²) of the pre-carbonized adhesive layer, and A2 is an area (mm²) of the graphitized adhesive layer.

The Sg value may be 8.5% or more.
The pre-carbonized adhesive layer may support a weight of 1.69 g/cm² or more.
The graphitized adhesive layer may support a weight of 1.97 g/cm² or more.
The pre-carbonized adhesive layer may be a coating layer or a film layer.
The adhesive layer may have Vg value of 56% or more, and the Vg value is represented by Equation 3 below:

$$Vg = \left\{1 - \left(\frac{V2}{V1}\right)\right\} \times 100\% \quad \text{[Equation 3]}$$

where V1 is a volume (mm³) of the pre-carbonized adhesive layer, and V2 is a volume (mm³) of the graphitized adhesive layer.

The adhesive layer may have a thickness of 3 μm or more.
Apart or all of at least one surface of the adhesive layer may be bonded to a surface having a coefficient of thermal expansion of 6 or less at 293.15 to 473.15 K.
The adhesive layer may include an adhesive resin.
The adhesive layer may further include a filler.
The adhesive resin may have an actual carbon ratio of 5 to 50 wt %.
The graphitized adhesive layer may be prepared by heat-treating the pre-carbonized adhesive layer at a temperature of 2000° C. or more.
A surface of the pre-carbonized adhesive layer may have an area of 7.85×10³ mm² or more and a surface of the graphitized adhesive layer may have an area of 5.50×10³ mm² or more.

In another general aspect, a method for preparing a laminate includes: disposing a pre-carbonized adhesive layer on a surface of a support or on a surface of a seed crystal, and preparing a laminate including the pre-carbonized adhesive layer interposed between the support and the seed crystal; and heat treating the pre-carbonized adhesive layer such that the laminate includes a carbonized adhesive layer;

wherein the carbonized adhesive layer may have Vr value of 28%/mm³ or more represented by Equation 1 below:

$$Vr = \left\{\frac{Sg}{(V1-V2)}\right\} \times 10^3 \quad \text{[Equation 1]}$$

where Sg (%) is represented by Equation 2 below, V1 is a volume (mm³) of the pre-carbonized adhesive layer and V2 is a volume (mm³) of the carbonized adhesive layer, $$Sg = \left\{1 - \left(\frac{A2}{A1}\right)\right\} \times 100\% \quad \text{[Equation 2]}$$

where A1 is an area (mm of the pre-carbonized adhesive layer, and A2 is an area (mm of the carbonized adhesive layer.

The heat treating may be performed at a temperature of 500° C. to 900° C.

The method may further include heat treating the carbonized adhesive layer such that the carbonized adhesive layer is graphitized.

The heat treating the carbonized adhesive layer may be performed at a temperature 2000° C. or more, such that the laminate includes a graphitized adhesive layer.

The heat treating the carbonized adhesive layer may further include growing an ingot on another surface of the seed crystal.

The graphitized adhesive layer may include a first surface or a second surface facing each other.

The first surface and the second surface of the graphitized adhesive layer may have a first bonding surface and a second bonding surface, respectively.

The second bonding surface may be in contact with a surface of the seed crystal.

A sum of an area of the first bonding surface and the second bonding surface may be 0.95 times or less of the a of an area of the first surface and second surface.

In another general aspect, a method of manufacturing a wafer includes: grinding an edge of the ingot grown on a surface of a seed crystal; and cutting the ground ingot to prepare the wafer.

In another general aspect, a laminate includes: a carbonized adhesive layer having a first surface and a second surface; a support disposed on the first surface; and a seed crystal disposed in contact with the second surface.

The carbonized adhesive layer may be obtained from carbonizing a pre-carbonized adhesive layer.

The pre-carbonized adhesive layer may be a coating layer or a film layer.

The carbonized adhesive layer may be a graphitized adhesive layer obtained by a heat treatment at a temperature of 2000° C. or more.

An area change of the carbonized adhesive layer may be greater than an area change of the seed crystal or an area change of the support, wherein the area change of the carbonized adhesive layer is a difference between an area of the pre-carbonized adhesive layer before the heat treatment and an area of the graphitized adhesive layer after the heat treatment, the area change of the seed crystal is a difference between an area of a surface of the seed crystal before and after the heat treatment, and the area change of the support is a difference between an area of a surface of the support before and after the heat treatment.

At least a portion of the first surface may be separated from the support, or at least a portion of the second surface may be separated from the seed crystal.

At least one surface of the support may have a coefficient of thermal expansion of 6 or less at 293.15 to 473.15 K.

At least one surface of the seed crystal may have a coefficient of thermal expansion of 4 or less at 293.15 to 473.15 K.

An area of the graphitized adhesive layer may decrease during the heat treatment and a cooling after the heat treatment.

The pre-carbonized adhesive layer may support a weight of 1.69 g/cm² or more.

The graphitized adhesive layer may support a weight of 1.97 g/cm² or more.

The laminate may include an ingot grown on a surface of the seed crystal opposite to the surface in contact with the second surface of the carbonized adhesive layer.

At least a portion of the first surface of the carbonized adhesive layer may be a first bonding surface in contact with a surface facing the first surface, and at least a portion of the second surface of the carbonized adhesive layer may be a second bonding surface in contact with the seed crystal, wherein a sum of areas of the first bonding surface and the second bonding surface may be 0.95 times or less of a sum of areas of the first surface and second surface.

The surface facing the first surface may be a surface of the support.

An area of the first bonding surface may be 0.3 times or more of an area of the first surface.

An area of the second bonding surface may be 0.3 times or more of an area of the second surface.

The carbonized adhesive layer may have a Vr value of 28%/mm³ or more represented by Equation 1 below:

$$Vr = \left\{\frac{Sg}{(V1 - V2)}\right\} \times 10^3 \quad \text{[Equation 1]}$$

where a Sg (%) is represented by Equation 2 below, V1 is a volume (mm³) of the pre-carbonized adhesive layer and V2 is a volume (mm³) of the graphitized adhesive layer, $$Sg = \left\{1 - \left(\frac{A2}{A1}\right)\right\} \times 100\% \quad \text{[Equation 2]}$$

where an A1 is an area (mm²) of the pre-carbonized adhesive layer, and A2 is an area (mm²) of the graphitized adhesive layer.

The seed crystal may have an area of 7.85×10³ mm² or more.

At least one surface of the seed crystal may have a surface roughness Ra of 5 μm or less.

In another general aspect, a method for preparing an ingot includes: placing a raw material and the laminate spaced apart from the raw material in a reactor having an internal space; sublimating the raw material by controlling a temperature, a pressure, and a gas atmosphere of the internal space; growing the ingot on the laminate; and collecting the ingot from the laminate by cooling the reactor.

The carbonized adhesive layer may be obtained from carbonizing a pre-carbonized adhesive layer, and the carbonized adhesive layer may be a graphitized adhesive layer obtained by a heat treatment at a temperature of 2000° C. or more.

An area of the graphitized adhesive layer may be reduced by more than 8.5% based on an area of the pre-carbonized adhesive layer.

At least a portion of the first surface of the carbonized adhesive layer may be a first bonding surface in contact with a surface facing the first surface, and at least a portion of the second surface of the carbonized adhesive layer may be a second bonding surface in contact with the seed crystal, wherein an area of the first bonding surface after the cooling may be 0.3 times or more of an area of the first surface and an area of the second bonding surface after the cooling may be 0.3 times or more of an area of the second surface.

In another general aspect, a method for preparing a wafer includes: grinding an edge of the ingot; and cutting the ground ingot to prepare the wafer.

The wafer manufactured from the ingot may have a warp value of 55 μm or less.

The ingot may be a SiC single crystal ingot.

BRIEF DESCRIPTION OF THE DRAWINGS

FIG. 1 is a conceptual view schematically showing the inside of the reactor after growth of the conventional silicon carbide ingot.

FIGS. 2A and 2B are conceptual views schematically showing an example (2A) and another example (2B) inside the reactor after ingot growth by applying the adhesive layer according to an embodiment.

FIG. 3 is a conceptual view schematically showing the laminate to which the adhesive layer is applied according to an embodiment.

FIG. 4 is a conceptual view schematically showing an example of growth apparatus of a SiC single crystal to which the adhesive layer is applied according to an embodiment.

FIG. 5 is an image sequentially showing (a) coating of the resin composition, (b) formation, (c) carbonization, and (d) graphitization of the adhesive layer.

FIGS. 6A and 6B are graphs showing the warp values of the wafers prepared with different cutting positions of the ingot in comparative example (6A) and example (6B).

FIGS. 7A and 7B are images showing the result of XRD mapping of the wafer in comparative example (7A) and example (7).

FIG. 8 is a conceptual view schematically showing shapes of the adhesive layer (c1) and (c2) separated from a seed crystal and a support after heat treatment (a) and after subsequent contraction (b) according to an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

Throughout the specification, when an element is "connected" to another element, this includes not only 'directly connected' but also 'connected with another element in the middle.'

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the specification, the term "combination of" included in Markush type description means mixture or combination of one or more elements described in Markush type and thereby means that the disclosure includes one or more elements selected from the Markush group.

Throughout the specification, the articles "a," "an," and "the" are intended to include the plural forms as well, unless the context clearly indicates otherwise.

In an effort to develop a method for producing an ingot with less defect and higher quality, it was confirmed that a good quality ingot may be prepared by applying an adhesive layer of seed crystal, which satisfies a certain graphitization shrinkage rate, during the process of growing a single crystal using physical vapor transport (PVT), which is a sublimation method.

An Adhesive Layer of Seed Crystal

In one general aspect, the adhesive layer of seed crystal according to an embodiment includes a graphitized adhesive layer. The graphitized adhesive layer is prepared by heat-treating a pre-carbonized adhesive layer. The adhesive layer of seed crystal 100 may have Vr value, which is represented by Equation 1 below, of 28%/mm³ or more:

$$Vr = \left\{ \frac{Sg}{(V1 - V2)} \right\} \times 10^3 \qquad \text{[Equation 1]}$$

where Sg (%) is represented by Equation 2 below, V1 is a volume (mm³) of the pre-carbonized adhesive layer, and V2 is a volume (mm³) of the graphitized adhesive layer measured at room temperature, $$Sg = \left\{1 - \left(\frac{A2}{A1}\right)\right\} \times 100\% \quad \text{[Equation 2]}$$

where A1 is an area (mm²) of the pre-carbonized adhesive layer, and A2 is an area (mm²) of the graphitized adhesive layer measured at room temperature.

The pre-carbonized adhesive layer may be graphitized at a temperature of 2000° C. or more. The composition and the method for preparing the adhesive layer of seed crystal will be described later.

The pre-carbonized adhesive layer may be a coating layer or a film layer, both of which will be described later.

The pre-carbonized adhesive layer is in a state in which an adhesive resin is polymerized and translucent. The pre-carbonized adhesive layer is an amorphous carbon and is distinguished from an opaque adhesive layer after carbonization. The adhesive resin will be described later.

The graphitized adhesive layer is formed when the pre-carbonized adhesive layer is heat-treated at the temperature of 2000° C. or more. The volume of the pre-carbonized adhesive layer decrease as the graphitized adhesive layer is formed.

The Sg value is a percentage of the area graphitized in the area of the pre-carbonized adhesive layer due to graphitization. The change may be a decrease.

The area of the pre-carbonized adhesive layer may be an area of a bonding surface adhered to the adherend (support, seed crystal, etc.). The area of the graphitized adhesive layer may be an area of the adhesive layer excluding the area contracted by graphitization from the area of the pre-carbonized adhesive layer.

Measurement of area, thickness and volume of the graphitized adhesive layer may be performed at room temperature, and the room temperature may be 20° C. to 30° C., specifically, 25° C.

The Sg value may be 8.5% or more, or 9% or more. The Sg value may be 11% or more, or 16% or more. The Sg value may be 30% or less. The Sg value may be 27% or less, or may be 21% or less.

When the Sg value exceeds 30%, the seed crystal including the ingot may be completely separated from the adhesive layer, thus the ingot may be damaged. Also, the area of the adhesive layer separated from the seed crystal or the support may be excessive, which causes quality deterioration of the ingot.

If the Sg value is less than 8.5%, the warp value of the ingot may not be good due to the stress between the seed crystal including the ingot and the adhesive layer or between the seed crystal and the support.

When the Sg value is in the range defined above, during the process of growing the ingot through sublimation in a temperature of 2000° C. or more and cooling, an effective partial separation between the adhesive layer and the adherend (support, seed crystal, etc.) is possible, and the stress on the ingot manufactured may be minimized. When the Sg value is 16% to 21%, the quality of the ingot manufactured may be further improved.

The method for measurement of the Sg value will be described in the following experimental examples, but is not limited thereto.

If the Vr value of the Equation 1 is in the range described below, a stress generation may be further reduced, and a high quality ingot may be grown and collected when manufacturing the ingot using the adhesive layer 100.

The Vr value may be 28% or more, or 28.7% or more. The Vr value may be 38.3% or more, or 52.3% or more. The Vr value may be 154.5% or less. The Vr value may be 77.8% or less, or 63.8% or less.

If the Vr value exceeds 154.5%, the defect density of the ingot grown using the adhesive layer 100 may be increased, and the resulting ingot may be completely separated from the adhesive layer, thereby damaging the ingot itself.

If the Vr value is less than 28%, the ingot grown using the adhesive layer 100 is susceptible to stress caused by the difference in coefficients of thermal expansion between the adherend (support, seed crystal, etc.) and the adhesive layer 100, and the quality of the resulting ingot may be not good.

When the Vr value is in the range defined above, stress on the ingot manufactured and the resulting defects may be minimized, and the seed crystal may be effectively separated from adhesive layer during the process of manufacturing the ingot.

When the Vr value is 53.7% to 64.1%, the quality of the ingot manufactured may further be improved.

The measurement of the Vr value will be described in the following experimental examples, but is not limited thereto.

When the adhesive layer 100 is a pre-carbonized adhesive layer of seed crystal, it may be a coating layer, or a film layer. When the adhesive layer is a coating layer, it may be in the form of a coating prepared by applying liquid adhesive resin composition. When the adhesive layer is a film layer, it may be in a cured form after the adhesive resin composition is applied.

The pre-carbonized adhesive layer 100 may support a weight of 1.69 g/cm² or more. The pre-carbonized adhesive layer 100 may support a weight of 10.7 g/cm² or more, or may support a weight of 15.4 g/cm². By supporting the weight in the range defined above, a laminate including the adhesive layer 100 interposed between the seed crystal and the support may be stably placed on the inner top of the reactor before growth of the ingot.

The adhesive layer 100, which is a coating layer, may include an adhesive resin, or may include an adhesive resin and a filler. The adhesive layer 100, which is a coating layer, may further include a solvent.

The adhesive layer 100, which is a coating layer, may be prepared by applying a liquid adhesive resin composition including an adhesive resin having a certain solid content and drying.

The solid content may be 16 wt % to 27 wt % and may be 18 wt % to 25 wt % based on the entire adhesive resin composition. The solid content may be 18 wt % to 22 wt % based on the entire adhesive resin composition.

Through the adhesive resin composition that satisfies the solid content defined above, the adhesive layer 100, which satisfies the Sg value and the Vr value defined above, may be prepared, while easily forming the adhesive layer on the adherend.

The solvent may include one selected from the group consisting of dimethylformamide (DMF), dimethylsulfoxide (DMSO), ethanol, methanol, acetone, and combinations thereof, but is not limited thereto.

The adhesive layer 100, which is the film layer, may include an adhesive resin, or may include an adhesive resin and a filler.

The adhesive layer 100, which is the film layer, may be prepared by applying the liquid adhesive resin composition and curing by heat treatment.

In a growth temperature atmosphere, in which growth of an ingot including sublimation of raw materials occurs, graphitization of the adhesive resin may be occurred as well. The adhesive resin, which can at least partially maintain the adhesion to the seed crystal and the support in the growth temperature of an ingot, may be used.

An actual carbon ratio of the adhesive resin may be 5 wt % to 50 wt %, or may be 10 wt % to 30 wt %. The adhesive layer including the adhesive resin having the range of actual carbon ratio defined above, may be effectively graphitized in the ingot growth step and may help to partially separate the adhesive layer 100 in the collection step after the ingot growth is finished.

Specifically, the adhesive resin may include one selected from the group consisting of polyacrylic acid resins, polyacrylonitrile resins, phenol resins, epoxy resins, polyvinyl chloride resins, and combinations thereof.

The filler may be one selected from the group consisting of graphite, coke, carbon black, carbon nanotubes, graphene, and combinations thereof. The filler may control the degree of shrinkage during graphitization of the adhesive layer 100.

The average particle diameter (D50) of the filler may be 1 µm or less. The average particle diameter (D50) of the filler may be 200 nm to 600 nm. The average particle diameter (D50) of the filler may be 250 nm to 550 nm and may be 280 nm to 520 nm.

When the filler has such a particle size, it is possible to maintain the adhesion properties of the adhesive layer of seed crystal 100, while minimizing the effects of stress on the ingot and easily controlling the volume and area change characteristics of the adhesive layer according to the temperature.

The amount of the filler added may be 0.5 wt % or more, or may be 1 wt % or more based on the entire weight of the solution containing the adhesive resin. The amount of the filler added may be 10 wt % or less, or 6 wt % or less based on the entire weight of the solution containing the adhesive resin. When the amount of the filler added is within the above range, it is possible to easily control the adhesion characteristics and the area change characteristics of the adhesive layer 100.

When the filler is added, the adhesive resin may be one selected from the group consisting of polyacrylic acid resin, polyacrylonitrile resin, phenol resin, and cresol novolac type resin. In addition, when the filler is added, the adhesive resin may be a polyacrylic acid resin or a polyacrylonitrile resin.

With the resin described above included in the adhesive layer 100, it is possible to maintain an optimal bonding area between the adherend, i.e., the seed crystal 110 and the support 120, and the graphitized adhesive layer while allowing a part of the bonding to be separated, thereby efficiently reducing the stress on the ingot and manufacturing a higher quality ingot.

The adhesive layer 100 may include a bonding surface to which the adherends, i.e., the support and the seed crystal, etc., are bonded, and the bonding surface includes the first surface and the second surface opposing the first surface.

Specifically, the support 120 may be bonded to the adhesive layer 100. One surface of the support 120 may face the first surface of the adhesive layer 100 and may be bonded to each other. The seed crystal 110 may also be bonded to the adhesive layer 120. One surface of the seed crystal 110 may be bonded to the second surface of the adhesive layer.

The adhesive layer 100 and the adherends, i.e., the support, and the seed crystal, etc., are bonded.

The coefficient of thermal expansion ($\times 10^{-8}/°$ C.) of the adherend may be 6 or less at 293.15 K to 473.15 K. The coefficient of thermal expansion ($\times 10^{-8}/°$ C.) of the adherend may be 5 or less, or 4.5 or less at 293.15 K to 473.15 K. The coefficient of thermal expansion ($\times 10^{-4}/°$ C.) of the adherend may be 1 or more, 2 or more, or 3 or more at 293.15 K to 473.15 K. The coefficient of thermal expansion ($\times 10^{-8}/°$ C.) of the adherend may be 3.7 to 4.2 at 293.15 K to 473.15 K.

When the coefficient of thermal expansion is in the range defined above, it is possible to induce partial separation of the adhesive layer and the adherend more appropriately during the heating and cooling process for ingot growth.

The seed crystal 110 may be applied differently depending on the properties of the ingot to be grown.

When the ingot is a SIC ingot, a SiC seed crystal may be applied. For example, 4H—SiC wafers, 6H—SiC wafers, 3C—SiC wafers, 15R—SiC wafers, and the like may be applied, but is not limited thereto, as long as the ingot can be grown through a sublimation method at a temperature of 2000° C. or more.

Various seed crystals 110 may be applied depending on the size of the ingot to be grown. The ingot may have a diameter of 4 inches or more, 5 inches or more, or 6 inches or more. The diameter of the ingot may be 4 inches to 12 inches, 4 inches to 10 inches, or 6 inches to 8 inches. The seed crystal 110 may be applied according to the characteristics of the ingot.

The seed crystal 110, which is capable of growing 4H—SiC single crystal, may be used. For example, seed crystal of 4H—SiC crystal, whose front surface where the ingot grows is C plane (000-1), may be used.

The support 120 may be used for placing the seed crystal 110 with the adhesive layer in the top of internal space of the reactor for growth of the ingot.

The support 120 may be made of graphite and may be the same as the material of crucible of the reactor used for growth of the ingot. In addition, the support 120 may be formed integrally or separately from the cover of the reactor.

The graphitized adhesive layer of seed crystal 100 may be prepared by heat treating the adhesive layer of seed crystal in an inert atmosphere such as nitrogen or argon gas, at a pressure of 10 torr to 50 torr, a heating rate of 5° C./min to 10° C./min, a temperature of 2000° C. to 2600° C. for 1 to 100 hours.

The area, volume, etc. of the graphitized adhesive layer of seed crystal are based on measurements at a temperature of 25° C.

In general, since the growth of the ingot and/or the graphitization of the adhesive layer is performed with a heat treatment at a high temperature, the area, volume, and the like of the graphitized adhesive layer are measured after the cooling process. In the cooling process, a cooling rate of 5° C./min to 10° C./min may be applied to the graphitized adhesive layer. In addition, the cooling may be performed under argon or nitrogen atmosphere of 5 to 750 torr.

The graphitized adhesive layer may support a weight of 1.97 g/cm² or more, or may support a weight of 12.5 g/cm² or more. The graphitized adhesive layer may support a weight of 51.3 g/cm² or less, or may support a weight of 35.9 g/cm² or less. By supporting the weight in the range defined above, even if the graphitized adhesive layer is partially separated from the adherend after growth and cooling of the ingot, the ingot may not be completely detached.

The adhesive layer may have a Vg value of 56% or more, or 71% or less, and Vg is represented by Equation 3 below:

$$V_g = \left\{1 - \left(\frac{V2}{V1}\right)\right\} \times 100\% \quad \text{[Equation 3]}$$

where V1 is the volume (mm³) of the pre-carbonized adhesive layer of seed crystal, and V2 is the volume (mm³) of the graphitized adhesive layer of seed crystal measured at room temperature.

V1 and V2 of Equation 3 may be the same as the value defined in Equation 1, and the conditions for the graphitization and the volume measurement of the Equation 3 may also be the same as described above.

When the adhesive layer satisfies the range of the Sg, Vr, and Vg value above, it is possible to easily induce the partial separation while maintaining sufficient adhesion with the adherend in the steps of growth and cooling of the ingot, and may produce ingot with less defects by stress.

The adhesive layer may have a thickness of 3 μm or more. The adhesive layer may have a thickness of 5 μm or more, or 10 μm or more. The thickness may be 100 μm or less. The thickness may be 80 μm or less, or 70 μm or less. It is possible to stably form an adhesive layer of seed crystal of a constant thickness within the thickness range defined above, and to more stably adhere the adherend such as the seed crystal 110 and the support 120.

The pre-carbonized adhesive layer (in the form of a coating layer or a film layer) may have an area of 7.85×10³ mm² or more, or 17.6×10³ mm² or more. The pre-carbonized adhesive layer may have an area of 70.6×10⁴ mm² or less, or 40.9×10⁴ mm² or less. When the area and thickness is in the range defined above, it is possible to secure a stable adhesion, and the partial separation of the adherend and the adhesive layer may be effectively established during growth and cooling of the ingot.

The area of the graphitized adhesive layer may be 5.50× 10³ mm² or more, 12.3×10³ mm² or more, 49.4×10³ mm² or less, or 28.6×10³ mm² or less. When the thickness is in the range defined above, the graphitized adhesive layer can be more easily separated partially from the adherend.

The volume of adhesive layer is changed during a heating and cooling process, at this time, tension in opposite directions is temporarily exerted at the interface between the adhesive layer and the adherend. It is considered that the adhesive force of the adhesive layer for adhering the adherend is temporarily decreased, thereby, partial separation of the adhesive layer of seed crystal occurs. In this case, when the ingot is located on the other surface of the seed crystal and its weight is increased, the partial separation may occur more advantageously.

Due to the partial separation of the adhesive layer, the stress caused by the difference in thermal expansion rate (or thermal contraction rate) generated during the heating and cooling process may substantially be eliminated, and the defects in the ingot due to the stress may significantly be reduced.

The characteristic of volume change of an adhesive layer is considered to be caused for at least two reasons. One may be that the volume of the adhesive resin included in the pre-carbonized adhesive layer decreases as the carbonization and graphitization process progress. The other is believed to be due to heat shrink and volume reduction during the cooling of the graphitized adhesive layer.

When it has characteristics of an appropriate range of thermal expansion (or thermal contraction) with the adherend, the adhesive layer may achieve a better effect.

However, since it is practically difficult to measure the thermal expansion rate (or coefficient of thermal expansion) at a temperature of 2000° C. or more, the coefficient of thermal expansion of the adherend (support, seed crystal, etc.) in the measurable temperature range is presented above.

FIGS. 1, 2A and 2B show a SiC ingot (FIG. 1) grown by using a conventional adhesive layer 10 and an ingot 130 grown by using the adhesive layer of seed crystal 100 according to an embodiment (FIGS. 2A and 2B), respectively.

As shown in FIG. 1, due to the difference in the coefficient of thermal expansion between the support 120 and the seed crystal 110 in the growth process of SIC ingot, the stress may be applied to the SiC ingot 130 during the process of growing the SiC ingot 130 including the heating and cooling process.

FIGS. 2A and 2B show shapes in which partial separation occurs between the support 120 and the seed crystal 110 according to the contraction of the adhesive layer 100. Accordingly, the warp of the cover 140 of the reactor located at the top of the support 120 can be suppressed, and the stress on the ingot 130 due to the difference in coefficient of thermal expansion with the support 120 can be minimized.

During the growth of the ingot 130, a polycrystal 131, which surround the seed crystal 110, the adhesive layer 100, and the outer circumferential surface of the support 120, may be formed, and then, as the adhesive layer 100 is contracted, a part of the polycrystal 131 may be broken.

As shown in FIG. 8, due to the growth and cooling of the ingot 130, the graphitized adhesive layer 100 is contracted (FIG. 8 (b), black arrow indicates contraction of adhesive layer), and partial separation may occur between the adherend 110 and 120 and the adhesive layer (FIG. 8 (c1), (c2)).

If the remaining adhered area, which is not separated between the graphitized adhesive layer and the adherend, is not more than 95% of the area of the graphitized adhesive layer (ie, the separated area is more than 5%), it may be considered that desired partial separation occurs.

The remaining adhered area unseparated may be 90% or less, or 77% or less of the area of the graphitized adhesive layer 100. The remaining adhered area unseparated may be 30% or more, or 45% or more of the area of the graphitized adhesive layer 100. When the graphitized adhesive layer 100 has the range of a remaining adhered area unseparated above, the partial separation of the adhesive layer 100 from the adherend 110 and 120 may be effectively achieved during growth and cooling of the ingot 130, and the seed crystal 110 and the ingot 130 located on the other surface of the seed crystal 110 may be supported by the adhesive layer, which is a bonding surface unseparated, so as not to be completely detached.

Method of Manufacturing Laminate

In another general aspect, a method of manufacturing laminate includes: disposing a pre-carbonized adhesive layer 100 on a surface of a support 120 or on a surface of a seed crystal 110; preparing the laminate comprising the pre-carbonized adhesive layer 100 interposed between the support 120 and the seed crystal 110; and heat treating the pre-carbonized adhesive layer 100 such that the laminate comprises a carbonized adhesive layer 100.

After the heat treating the pre-carbonized adhesive layer for carbonization, the carbonized adhesive layer may further be heat treated.

The further heat treatment is for producing a laminate including a graphitized adhesive layer of seed crystal by performing a graphitization heat treatment at a temperature of 2000° C. or more.

The adhesive layer 100 may have a Vr value of 28%/mm³ or more represented by Equation 1 below:

$$Vr = \left\{ \frac{Sg}{(V1 - V2)} \right\} \times 10^3 \quad \text{[Equation 1]}$$

where Sg (%) is represented by Equation 2 below, V1 is a volume (mm³) of the pre-carbonized adhesive layer, and V2 is a volume (mm³) of the carbonized adhesive layer measured at room temperature, $$Sg = \left\{ 1 - \left( \frac{A2}{A1} \right) \right\} \times 100\% \quad \text{[Equation 2]}$$

where A1 is an area (mm²) of the pre-carbonized adhesive layer, and A2 is an area (mm²) of the carbonized adhesive layer measured at room temperature.

The adhesive layer may include a first surface and a second surface.

The pre-carbonized adhesive layer may include an adhesive layer, which is a coating layer, or an adhesive layer, which is a film layer.

The carbonized adhesive layer may include the coating layer or the film layer, which are heat-treated for carbonization.

During preparing of the laminate, the pre-carbonized adhesive layer is prepared on one surface of the support 120 or one surface of the seed crystal 110, and the laminate including the adhesive layer interposed between the support 120 and the seed crystal 110 is prepared.

The laminate may include the adhesive layer, the support 120 disposed on the first surface of the adhesive layer, and the seed crystal 110 disposed on the second surface of the adhesive layer.

The seed crystal 110 and the support 120 of the laminate are the same as the seed crystal and the support, described as the adherend, in the description of the adhesive layer, respectively.

The adhesive layer 100 of the laminate is the pre-carbonized adhesive layer, and may be in the form of a coating layer or a film layer, and same as described in the description of the adhesive layer.

When the adhesive layer 100 of the laminate is the adhesive layer of seed crystal, which is a coating layer, it may be a liquid having a certain wt % of solid content by mixing the adhesive resin and the solvent.

When the adhesive layer 100 of the laminate is the adhesive layer of seed crystal, which is a coating layer, it may be a coating layer where the solvent is partially removed from the liquid adhesive layer and is dried.

When the adhesive resin is a polyacrylic acid resin, a polyacrylonitrile resin or a cresol novolac-type resin, a solid content may be 16 wt % to 27 wt % mixed with the solvent. The solid content may be 18 wt % to 25 wt %, or may be 18 wt % to 22 wt %.

Through the adhesive resin composition having the solid content described above, it is possible to manufacture the adhesive layer 100 satisfying the Sg and Vr value defined above while having a stable workability.

When the adhesive layer of the laminate (the pre-carbonized adhesive layer of seed crystal) is in the form of a coating layer, it may be formed by applying an adhesive layer resin composition on one surface of the support 120 or the seed crystal 110. Specifically, the applying may be performed by a method of applying a conventional liquid material, and spin coating may be used, but is not limited thereto.

In the application, the applying thickness may be 3 μm or more, 5 μm or more, or 10 μm or more. The applying thickness may be 100 μm or less, 80 μm or less, or 70 μm or less. In the thickness range above, the adherend such as the seed crystal 110 and the support 120 may be stably adhered, and in the subsequent step, the seed crystal 110 and the support 120 may be appropriately partially separated.

When the adhesive layer 100 of the laminate (the pre-carbonized adhesive layer of seed crystal) is in the form of a film layer, it may be prepared by curing heat treatment of the adhesive layer of seed crystal, which is the coating layer.

The temperature of curing heat treatment may be 100° C. to 450° C., 120° C. to 420° C., or 150° C. to 420° C. The time for heat treatment may be 1 hour to 10 hours.

If the temperature of heat treatment is less than 100° C., the degree of crosslinking of the adhesive layer in the form of a film layer may not be sufficient. If the temperature of heat treatment is more than 450° C., the degree of volume change of the adhesive layer in the form of a film layer may be decreased in the subsequent process.

As shown in FIG. 3, the laminate may be prepared by disposing the adhesive layer 100 on the support 120 and disposing the seed crystal 110 on the adhesive layer 100.

The support 120 may be a seed crystal holder and may be a cover of the reactor 140.

The support 120 may be formed separately or integrally with the cover of the reactor 140.

During the heat treating, the pre-carbonized adhesive layer 100 is carbonized such that the laminate includes the carbonized adhesive layer of seed crystal.

The temperature of the heat treatment for the carbonization may be 500° C. or more, or 600° C. or more. The temperature of the heat treatment for the carbonization may be 900° C. or less, or 800° C. or less. In the temperature range above, the carbonization of the adhesive layer 100 may be easily performed and energy waste may be minimized.

The carbonization may be performed in an inert gas atmosphere such as argon or nitrogen and may be performed at a pressure of 1 torr to 750 torr for 1 to 10 hours.

The method may further include cooling the carbonized laminate, and it may be cooled to a room temperature of 20° C. to 30° C.

The method may further include a further heat treatment after the carbonization.

In the further heat treatment step, the laminate including a graphitized adhesive layer of seed crystal may be prepared by graphitization heat treatment of the laminate at a temperature of 2000° C. or more.

The temperature of the further heat treatment may be 2000° C. or more, 2200° C. or more, or 2300° C. or more. The temperature may be 2600° C. or less or may be 2500° C. or less. In the temperature range above, the graphitization of the adhesive layer of seed crystal may be effectively performed.

The further heat treatment step may be performed for 1 to 100 hours in an inert atmosphere of 1 torr to 200 torr pressure and the heating rate of 1° C./min to 10° C./min. The further heat treatment step may be performed for 5 to 48 hours in an inert atmosphere of 10 torr to 50 torr pressure and the heating rate of 5° C./min to 10° C./min. In the ranges of temperature, pressure, and heating rate described above, the graphitization of the adhesive layer 100 may be performed more efficiently.

The adhesive layer 100 graphitized by the further heat treatment may have a first surface and a second surface and may have a bonding surface bonded to an adherend. The first surface is one surface of the graphitized adhesive layer of seed crystal, and the second surface is the other surface of the graphitized adhesive layer of seed crystal.

The adhesive layer 100 graphitized by the further heat treatment step may have a bonding surface bonded to the surface of the adherend facing the bonding surface. The bonding surface may include a first bonding surface and a second bonding surface.

The first bonding surface is a bonding surface in contact with a surface of the adherend facing the first surface. The first bonding surface may be a bonding surface in which the first surface and one surface of the support contact each other.

The second bonding surface may be a surface contacting one surface of the seed crystal facing the second surface.

When the sum of the area of the first bonding surface and the second bonding surface is less than a certain multiple of the sum of the area of the first surface and the second surface, it may be considered that partial separation has been made.

The sum of the area of the first bonding surface and the second bonding surface may be 0.95 times or less, or 0.90 times or less of the sum of the area of the first surface and the second surface. The sum of the area of the first bonding surface and the second bonding surface may be 0.77 times or less of the sum of the area of the first surface and second surface.

The sum of the area of the first bonding surface and the second bonding surface may be 0.30 times or more, or 0.45 times or more of the sum of the area of the first surface and the second surface.

If the sum of the area of the first bonding surface and the second bonding surface is within the range above, when growing an ingot by applying the adhesive layer of seed crystal, it is possible to minimize the stress between the ingot and the support, which may occur due to the thermal expansion rate (thermal contraction rate) during the growth and cooling of the ingot, and to provide a better quality ingot.

As shown in FIG. 8, after the heat treatment step, due to the contraction of the adhesive layer 100 caused by the graphitization (FIG. 8 (b)), partial separation may occur between the support 120 and the adhesive layer 100 and between the seed crystal 110 and adhesive layer (FIG. 8 (c1) and (c2)). Thus, the stress on the seed crystal and the ingot by the difference in the coefficient of thermal expansions of the support and the seed crystal can be minimized.

The further heat treatment step for the graphitization may be performed concurrently with the growing the ingot on one surface of the seed crystal. Alternatively, the graphitization of the adhesive layer and the growing of the ingot may be sequentially performed.

In the growing, the raw material 300 may be placed on the bottom of internal space of the reactor and the laminate may be placed on the top of internal space of the reactor, and the other surface of the seed crystal of the laminate may face the raw material 300.

An example of an apparatus for manufacturing an ingot is schematically shown in FIG. 4. Referring to FIG. 4, the reactor may be fixed by being surrounded by the heat insulating material 400, and the heat insulating material 400 surrounding the reactor may be disposed in the reaction chamber 420 such as a quartz tube. The temperature of the internal space of the reactor may be controlled by the heating means 500 disposed outside the heat insulating material 400 and the reaction chamber 420.

As long as it is suitable for growth of SIC ingot 130, various reactors may be used, and specifically, a graphite crucible may be used.

The reactor may include a main body including an internal space and an opening and a cover corresponding to the opening to seal the internal space. In the cover, the laminate may be placed on the surface facing the internal space of the reactor, and one surface of the support of the laminate may be in contact with the cover.

The heat treatment for growing the ingot may be carried out by heating the reactor and the internal space of the reactor by the heating means 500, decompressing the internal space concurrently or separately with the heating, and injecting inert gas, such that the growth of the ingot may occur.

The temperature, the pressure, the atmosphere, and the heating rate of the heat treatment may be as described above.

With the ingot 130 manufactured through the heat treatment for the growing, the cutting step of separating the ingot from the laminate may be simplified. The separated ingot may be processed into wafer using an external grinding machine to trim the outer edge of the ingot, slicing them into a certain thickness, and processing such as edge grinding, surface grinding, and polishing.

Wafers made from the ingot may have a warp value of 55 μm or less, or 30 μm or less. The ingot having these characteristics can produce a wafer having excellent properties. The measurement of the warp value may be performed as described in the following experimental example.

The method of manufacturing the laminate may further include cooling the laminate produced by the heat treatment step.

The cooling may be performed at a cooling rate of 1° C./min to 10° C./min for 24 hours to 48 hours. The cooling may be performed in a state in which the pressure of the internal space is raised to 700 torr to 800 torr.

Sg value of the equation 2 and Vr value of the equation 1 for the method of manufacturing laminate is as described above in the description of the adhesive layer 100, the measurement of these values is as described in the following experimental examples, but is not limited thereto.

The laminate manufactured by the method may be partially separated from the adherend due to contraction of the adhesive layer having the unique Vr and Sg values. When the growth step for the ingot is included in the heat treatment step of the manufacturing method, an ingot with excellent quality may be prepared.

A Laminate

In another general aspect, a laminate includes: carbonized adhesive layer 100 having a first surface and a second surface; a support 120 disposed on the first surface; and a seed crystal 110 disposed in contact with the second surface.

The first surface and one surface of the support may face each other.

The second surface and one surface of the seed crystal 110 may be in contact with each other.

The carbonized adhesive layer 100 may be prepared by carbonizing the pre-carbonized adhesive layer.

The pre-carbonized adhesive layer may be a coating layer or a film layer.

The carbonized adhesive layer 100 may be graphitized by a further heat treatment at a temperature of 2000° C. or more to form a graphitized adhesive layer.

The area change of the adhesive layer is a difference between the area of the graphitized adhesive layer and the area of the pre-carbonized adhesive layer.

The area change of the seed crystal 110 is an area change of one surface of the seed crystal before and after the heat treatment.

The area change of the support 120 is an area change of one surface of the support before and after the heat treatment.

The area change of the adhesive layer 100 may be greater than the area change of the seed crystal or the area change of the support.

At least a part of the first surface or at least a part of the second surface of the graphitized adhesive layer 100 may be separated from a surface adjacent to the first surface or the second surface.

The area change of the adhesive layer 100 measured at room temperature before and after the heat treatment at 2000° C. or more may be greater than the area change of the support 120 or the area change of the seed crystal 110.

At least a part of the first surface or at least a part of the second surface of the adhesive layer after the heat treatment at 2000° C. or more may be separated without directly adhering to the adjacent surface.

Specifically, the adhesive layer 100 before the heat treatment at 2000° C. or more may be a pre-carbonized adhesive layer, and the adhesive layer after the heat treatment is a graphitized adhesive layer.

The area change of the adhesive layer 100 is a difference between the area of the graphitized adhesive layer and the area of the pre-carbonized adhesive layer.

The area change of the adhesive layer 100 may be a value obtained by subtracting the area of the graphitized adhesive layer from the area of the pre-carbonized adhesive layer.

The pre-carbonized adhesive layer 100 may be a coating layer or a film layer.

The adhesive layer 100 is cooled to room temperature after the heat treatment at 2000° C. or more, is graphitized, and an area of the adhesive layer 100 may be reduced.

Detailed descriptions of the seed crystal 110, the support 120, and their features are the same as described above in the description of the seed crystal and the support.

The surface in contact with the first surface of the support 120 may have a coefficient of thermal expansion of 6 or less at 293.15 to 473.15 K. The description related to the coefficient of thermal expansion of the surface in contact with the support or the first surface is same as the description of the adherend described above.

The surface in contact with the second surface of the seed crystal 110 may have a coefficient of thermal expansion of 4 or less at 293.15 to 473.15 K. The description related to the coefficient of thermal expansion of the surface in contact with the seed crystal or the first surface is same as described above in the description of the adherend.

The laminate may include an ingot 130 grown on the other surface of the seed crystal 110.

The adhesive layer 100 may be a pre-carbonized adhesive layer of seed crystal.

A detailed description such as the description of the pre-carbonized adhesive layer of seed crystal 100 and a description of the weight supported by the pre-carbonized adhesive layer of seed crystal is the same as described above.

The carbonized adhesive layer of seed crystal 100 is obtained by carbonizing the pre-carbonized adhesive layer with a heat treatment, and substantially no bubble may be formed on the surface thereof.

The graphitized adhesive layer 100 is obtained by graphitizing the carbonized adhesive layer with a further heat treatment.

Detailed description of the graphitization and the graphitized adhesive layer 100 is as described above.

As described above, the area of the graphitized adhesive layer 100 may be decreased during the heat treatment and the cooling after the heat treatment.

The adhesive layer 100 may have a bonding surface bonded to a surface facing the bonding surface. The first bonding surface may be a surface in which the first surface is in contact with one surface of the support 120, and the second bonding surface is a surface in which the second surface is in contact with one surface of the seed crystal 110. As described above, the sum of the first bonding surface and the second bonding surface is 0.95 times or less of the sum of the first surface and the second surface.

The adhesive layer 100 may have the characteristics of the Vr value, the Sg value, and the Vg value described above, and the detailed description thereof is as described above.

The adhesive layer 100 may have a thickness of 3 μm or more, and the description of the thickness of the adhesive layer is as described above.

A detailed descriptions of the area of the seed crystal 110, the area of the support 120, the area of the adhesive layer 100 and the like are as described above.

Detailed descriptions of the roughness of the seed crystal 110, the roughness of the support 120 and the like are as described above.

Method of Manufacturing Ingot

In another general aspect, a method of manufacturing ingot includes: placing a raw material and the laminate spaced apart from the raw material in a reactor having an internal space; sublimating the raw material by controlling a temperature, a pressure, and a gas atmosphere of the internal space; growing the ingot on the laminate; and collecting the ingot from the laminate by cooling the reactor When the ingot is a SIC ingot, the raw material may include one selected from the group consisting of carbon, silicon, silicon carbide and combinations thereof.

The ingot may further include a dopant in the raw material. The dopant may be applied without limitation as long as the material is applicable as a dopant.

Detailed descriptions of the configuration of the laminate and the features of each configuration are as described above.

The preparation of the laminate may be performed by the method of manufacturing laminate described above.

Descriptions of the temperature, the pressure, and the gas atmosphere of the internal space in growing the ingot are as described above.

In the cooling step, the description of the laminate, which further include the ingot, and the description of the cooling rate are as described above.

The area of the graphitized adhesive layer of may be reduced by 8.5% or more based on the area of the pre-carbonized adhesive layer of the laminate. When the area is reduced, the adhesive layer may be partially separated from the ingot or the seed crystal including the ingot, thereby minimizing the influence of stress that may occur during thermal expansion and thermal contraction, and manufacturing an ingot having better properties.

A detailed description of the ingot is as described above.

The ingot may be a SiC ingot.

The ingot may be a SiC single crystal ingot.

The adhesive layer of seed crystal, the laminate, etc. may be applied to provide a higher quality SiC ingot.

Wafer and Method of Manufacturing Wafer

In another general aspect, a method of manufacturing wafer includes: grinding the edge of the ingot 130 manufactured by the method of manufacturing the ingot; and a cutting step of cutting the ground ingot to prepare the wafer.

In the grinding, from edge of the ingot 130 to inside, more than 5% of the cross-sectional area can be ground.

In the grinding, the ingot may be ground to have a uniform cross section in direction of the other surface, which is the surface of the portion of growth termination at the bottom of the SIC ingot and also where the seed crystal is in contact with the ingot 130, and toward the center axis.

In the cutting, the ingot may be cut to have a certain off angle with the bottom or (0001) surface of the ingot.

The off angle of the cutting may be 0 degree to 10 degrees.

The cutting may be performed so that the thickness of the wafer is 300 μm to 600 μm.

The method of manufacturing wafer may further include planarizing a thickness of the wafer after the cutting.

The method of manufacturing wafer may further include grinding the edge of the wafer after the cutting.

The method of manufacturing wafer may further include etching and polishing the surface of the wafer after the cutting.

The planarizing, the grinding, the etching, and the polishing may be performed in a proper order using a conventional method and may be performed in the order of a flattening-grinding-surface treatment.

The method of manufacturing the wafer may be a method of manufacturing a SIC wafer.

The ingot may be a SiC ingot or may be a substantially monocrystalline SiC ingot.

The SiC wafer has the features described below.

The silicon carbide wafer may have a locking angle of −1.5 degree to +1.5 degree relative to the reference angle based on the wafer to which the off angle is applied at any angle selected from 0 to 10 degrees with respect to the (0001) plane.

Based on the wafer applying the off angle at any angle selected from 0 to 10 degrees with respect to the (0001) plane, the SiC wafer may have a locking angle of −1.5 degree to +1.5 degree relative to the reference angle, −1.0 degree to +1.0 degree relative to the reference angle, −0.1 degree to +0.1 degree relative to the reference angle, or −0.05 degree to +0.05 degree relative to the reference angle.

Specifically, the wafer having an off angle of 0 degree with respect to the (0001) plane may have a locking angle of −1.0 degree to +1.0 degree relative to the reference angle, −0.5 degree to +0.5 degree relative to the reference angle, −0.1 degree to +0.1 degree relative to the reference angle, or −0.05 degree to +0.05 degree relative to the reference angle. The ingot with these characteristics has excellent crystalline properties.

Specifically, the wafer having an off angle of 4 degree with respect to the (0001) plane may have a locking angle of −1.0 degree to +1.0 degree relative to the reference angle, −0.5 degree to +0.5 degree relative to the reference angle, −0.1 degree to +0.1 degree relative to the reference angle, or −0.05 degree to +0.05 degree relative to the reference angle. The ingot with these characteristics has excellent crystalline properties.

Specifically, the wafer having an off angle of 8 degree with respect to the (0001) plane may have a locking angle of −1.0 degree to +1.0 degree relative to the reference angle, −0.5 degree to +0.5 degree relative to the reference angle, −0.1 degree to +0.1 degree relative to the reference angle, or −0.05 degree to +0.05 degree relative to the reference angle. The ingot with these characteristics has excellent crystalline properties.

The locking angle, meaning of the off angle of X degree, meaning of the locking angle of "−1 to +1 degree relative to the reference angle", the omega angle, and the handling thereof may be the same as described above.

Hereinafter, while embodiments of the present disclosure will be described in more detail with reference to the accompanying examples, it should be noted that examples are not limited to the following.

Preparation of Adhesive Layer of Seed Crystal and Graphitized Adhesive Layer of Seed Crystal Adhesive resin: a polyacrylic acid resin, a polyacrylonitrile resin, a phenol resin, and a trimethylsilyl ether group-containing cresol novolac resin as described in Formula 1 below were used.

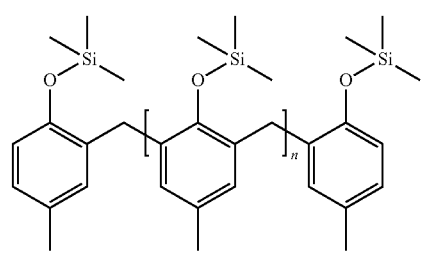

[Formula 1]

where n is an integer of 1 to 1000.

Filler: a crystalline graphite powder having an average particle size (D50) of 400 nm was used.

Solvent: Dimethylformamide and ethanol were used.

Preparation of liquid adhesive composition: each adhesive resin was mixed to have a ratio and solid content listed in Table 1 to prepare the adhesive resin composition. For phenolic resin, liquid phenolic resin was used.

Preparation of an adhesive layer of seed crystal: As shown in FIG. 3, the liquid composition was applied on the support 120 or the seed crystal 110 by spin coating to have the thickness and the area listed in Table 1, and heat treatment was carried out in muffle furnace at the temperature listed in table 1. The support 120 having the surface roughness (Ra) of 0.1~5 um was used and the seed crystal 110 having the surface roughness (Ra) of 0.01~5 nm was used.

Preparation of graphitized adhesive layer of seed crystal: the prepared adhesive layer of seed crystal was graphitized in an induction furnace at the temperature listed in table 1.

Growth of SIC Ingot

As shown in FIG. 4, SiC raw materials 300 were placed in the bottom of internal space of the reactor. The liquid composition for the production of the adhesive layer of seed crystal 100 was interposed with a thickness of 10 um between the support 120 and the 6 inches 4H SIC seed crystal 110, and the laminated body was prepared by filmizing the liquid composition at the temperature of 250° C. in muffle furnace. The laminated body was heat-treated at the temperature of 600° C. to prepare a laminate in which the adhesive layer of seed crystal was carbonized.

The prepared laminate was disposed at the top of internal space of the reactor. At this time, the SIC seed crystal of the laminate was placed such that the C surface ((000-1) plane) of the SIC seed crystal faces the SIC raw material of bottom of the internal space.

After the reactor was sealed and the outside was surrounded by the heat insulating material 400, the reactor was placed in the reaction chamber 420 provided with the heating coil, which is the heating means 500.

The internal space of the reactor was reduced in pressure to the vacuum atmosphere, and argon gas was injected to allow the internal space to reach atmospheric pressure, and then the internal space was decompressed again. At the same time, the temperature of the internal space was raised to a temperature of 2200 to 2600° C. at a heating rate of 5 to 10° C./min.

A SIC ingot was grown on the SIC seed crystal facing the SIC raw material at a pressure of 5 torr for 100 hours. Then, it was cooled at a cooling rate of 10° C./min so as to have an argon gas atmosphere of 5 to 760 torr and a temperature of 25° C.

Evaluation of Adhesive Layer of Seed Crystal, and Laminate

1) Sg: Under the conditions of Table 1, the original area A1 of the adhesive layer of seed crystal was measured, and the area A2 was measured, which is cooled to room temperature after the graphitizing heat treatment under the condition of manufacturing the SiC ingot described above. The Sg was calculated using Equation 2 above.

2) Thickness change: The thickness of the adhesive layer of seed crystal was measured under the conditions of Table 1, and the thickness change was calculated by measuring the thickness of the adhesive layer, which is cooled to room temperature after the graphitizing heat treatment under the condition of manufacturing the SiC ingot described above. The thickness was measured using a dial gauge.

3) Vr: Using the area value of 1) and the thickness value of 2), the original volume of V1 and the volume of V2, which is cooled to room temperature after graphitizing heat treatment, were calculated. The Vr was calculated using Equation 1 above.

4) Vg: Applying the value of V1 and V2 of 3) to Equation 3 above, Vg was calculated.

5) Adhesive area after graphitization: A degree of gap between the adhesive layer of seed crystal, which was graphitized and cooled under the condition of manufacturing the SiC ingot described above, and the adherend (support, seed crystal) was measured by 0.02 mm of gap gauge.

Property Test of Wafer Manufactured from SIC Ingot

1) Warp value test: the warp value of a wafer having a 4 degree off angle by cutting each part of the ingot (distance when the surface of seed crystal is indicated No. 0) was measured by the AutoScan 200 of MTI Instruments, Inc.

2) Surface test of wafer: A wafer with a 4 degree off angle based on the (0001) plane of the ingot was prepared. Using a high resolution X-ray diffraction analysis system (HR-XRD system, Rigaku's SmartLab High Resolution X-ray Diffraction System), the direction of the wafer [11-20] was aligned to the X-ray path. After setting the X-ray source optic and X-ray detector optic angle to 2θ (35 to 36 degree), the locking angle was measured by controlling the omega (ω, or theta θ, X-ray detector optic) angle according to the off angle of the wafer. Specifically, the omega angle was 17.8111 degree based on 0 degree off, the omega angle was 13.811 degree based on 4 degree off, and the omega angle was 9.8111 degree based on 8 degree off. X-ray power was 9 kW, X-ray target was Cu, and Goniometer resolution was 0.0001 degree. The FWHM of rocking curves were measured based on the angle at Max Intensity, and were evaluated by arcsec, respectively. 167 points were measured at 10 mm intervals in the wafer surface, and the results are shown in FIG. 7.

TABLE 1

| | Adhesive resin | Additive content of filler (wt %) | solid (wt %) | adhesive layer | | | graphitized adhesive layer | | | coefficient of thermal expansion of seed crystal holder ($10^{-6}$/° C.) (293~473 K) |
|---|---|---|---|---|---|---|---|---|---|---|
| | | | | Temperature of heat treatment (° C.) | Thickness (μm) | Area (mm$^2$) | Temperature of heat treatment (° C.) | Thickness (μm) | Area (mm$^2$) | |
| Example 1 | PAA | X | 18 | 250 | 55 | 10000 | 2600 | 22 | 7380 | 4 |
| Example 2 | PAA | X | 18 | 420 | 75 | 10000 | 2600 | 30 | 7516 | 4.1 |
| Example 3 | PAA | X | 18 | 250 | 50 | 10000 | 2600 | 21 | 7280 | 4 |
| Example 4 | PAA | X | 18 | 250 | 25 | 10000 | 2600 | 11 | 7430 | 3.9 |
| Example 5 | PAN | X | 22 | 150 | 50 | 10000 | 2600 | 22 | 7530 | 3.8 |
| Example 6 | PAN | X | 22 | 150 | 55 | 10000 | 2600 | 23 | 7612 | 3.8 |
| Example 7 | Phenol | X | — | 150 | 50 | 10000 | 2600 | 25 | 8803 | 3.9 |
| Example 8 | Phenol | X | — | 150 | 50 | 10000 | 2600 | 24 | 8879 | 3.9 |
| Example 9 | TMSCN | X | 25 | 150 | 52 | 10000 | 2400 | 20 | 9046 | 4 |
| Example 10 | PAA | 2 | 18 | 250 | 55 | 10000 | 2500 | 28 | 8242 | 4.1 |
| Example 11 | PAA | 2 | 18 | 250 | 54 | 10000 | 2500 | 28 | 8358 | 4.1 |
| Example 12 | PAN | 2 | 22 | 150 | 55 | 10000 | 2500 | 27 | 7922 | 4.1 |
| Example 13 | PAN | 2 | 22 | 150 | 55 | 10000 | 2500 | 28 | 7892 | 4.1 |
| Example 14 | Phenol | 2 | — | 150 | 55 | 10000 | 2500 | 26 | 9088 | 4.1 |
| Comparative example1 | Phenol | 2 | — | 150 | 55 | 10000 | 2500 | 27 | 9158 | 4.1 |
| Comparative example2 | TMSCN | 2 | 25 | 150 | 55 | 10000 | 2500 | 25 | 9248 | 4.1 |
| Comparative example3 | TMSCN | 2 | 25 | 150 | 55 | 10000 | 2500 | 24 | 9288 | 4.1 |

(PAA: polyacrylic acid, PAN: polyacrylonitrile, TMSCN: cresol novolac containing a trimethylsilyl ether group, content of filler is based on total weight % of the liquid composition containing adhesive resin)

TABLE 2

| | Adhesive resin | Additive content of filler (wt %) | solid (wt %) | Sg (%) | Vr (%) | Vg (%) | Partial separation | Average warp value of manufactured wafer (μm) |
|---|---|---|---|---|---|---|---|---|
| Example 1 | PAA | X | 18 | 26.20 | 67.6 | 70.5 | ○ | — |
| Example 2 | PAA | X | 18 | 24.84 | 47.4 | 69.9 | ○ | — |
| Example 3 | PAA | X | 18 | 27.20 | 78.4 | 69.4 | ○ | — |
| Example 4 | PAA | X | 18 | 25.70 | 152.7 | 67.3 | ○ | — |
| Example 5 | PAN | X | 22 | 24.70 | 73.9 | 66.9 | ○ | — |
| Example 6 | PAN | X | 22 | 23.88 | 63.7 | 68.2 | ○ | — |
| Example 7 | Phenol | X | — | 11.97 | 42.8 | 56.0 | ○ | — |
| Example 8 | Phenol | X | — | 11.21 | 39.1 | 57.4 | ○ | — |
| Example 9 | TMSCN | X | 25 | 9.54 | 28.1 | 65.2 | ○ | — |
| Example 10 | PAA | 2 | 18 | 17.58 | 55.1 | 58.0 | ○ | 30 |
| Example 11 | PAA | 2 | 18 | 16.42 | 53.7 | 56.7 | ○ | 35 |
| Example 12 | PAN | 2 | 22 | 20.78 | 61.8 | 61.1 | ○ | — |
| Example 13 | PAN | 2 | 22 | 21.08 | 64.1 | 59.8 | ○ | — |
| Example 14 | Phenol | 2 | — | 9.12 | 29.1 | 57.0 | ○ | — |
| Comparative example1 | Phenol | 2 | — | 8.42 | 27.8 | 55.0 | X | — |
| Comparative example2 | TMSCN | 2 | 25 | 7.52 | 23.6 | 58.0 | X | 100 |
| Comparative example3 | TMSCN | 2 | 25 | 7.12 | 21.8 | 59.5 | X | 98 |

(Partial separation: after heat treatment (growth step), the bonding surface between the graphitized adhesive layer and the adherend is 95% or less than the cross-sectional area of the graphitized adhesive layer, Average warp value of wafer (μm): 30 or less Good, 31~59 Normal, 60 or more bad, "—" indicates no measurement.)

Referring to Table 1 and Table 2, the sample to which the acrylic resin, the acrylic resin with the filler, the phenol resin without the filler, and the cresol novolak resin was applied, had a Sg value of 9.12% to 27.2% and a Vr value of 28.1% to 152.7%. When the entire liquid composition is 100 wt %, the samples including the phenol resin and cresol novolak resin, to which 2 wt % of fillers were added, showed that the Sg value was 8.42% or less and the Vr value was 27.8% or less.

In the case of the sample using the acrylic resin having a solid content of 18 to 22% by weight of the filler, the Sg value was 16.42% to 21.08%, and the Vr value was 53.7% to 64.1%. The average warpage value of the resulting wafers was good.

Samples with fillers including acrylic resins having 18 to 22 wt % of solids showed Sg values of 16.42% to 21.08% and Vr values of 53.7% to 64.1%, and the average warp value of the wafer prepared from the ingot with the corresponding conditions was good.

In addition, when an adhesive layer having an Sg value of 8.42% or less and a Vr value of 27.8% or less is applied, although the ingot (seed crystal) was not partially separated from the adherend (seed crystal, support), it was confirmed that the bonding area between the graphitized adhesive layer and the adherend is not more than 95% of the bonding area before the graphitizing heat treatment, thereby partially separating.

FIGS. 6A and 6B are graphs showing the warp value of the wafer according to the relative distance (Wafer No.) from the seed crystal, when cutting the wafer from the manufactured ingot. Referring to FIGS. 6A and 6B, a wafer prepared from the ingot grown with the conditions of comparative example 3 (6A) has an average warp value of 98 μm or more. Also, the warp value of the wafer manufactured at the ingot site (Wafer No. 2) near the seed crystal was 140 μm or more. In the wafer prepared from the ingot grown with the conditions of example 10 (6B), the wafer manufactured in the ingot site (Wafer No. 2) near the seed crystal showed the warp value of 45 μm or less and the average warp value of 30 μm or less.

FIGS. 7A and 7B are images showing the results of XRD mapping of the wafer in comparative example (7A) and an example (7B). The rectangular spaces of the x and y axes of FIGS. 7A and 7B are each 10 mm. Referring to FIGS. 7A and 7B, in an ingot manufactured under the conditions with comparative example 3 (7A), a wafer (Wafer No. 8) cut at 5 mm distance from the surface of the seed crystal showed a maximum value of 153.7 arcsec, a minimum of 42.9 arcsec, and an average of 63.5 arcsec, and curvature was 14.3 m. In an ingot manufactured under the conditions of example 10 (7B), a wafer (Wafer No. 8) cut at 5 mm distance from the surface of the seed crystal showed a maximum value of 106.9 arcsec, a minimum of 19.7 arcsec, and an average of 27.1 arcsec, and curvature was −19.1 m. It was confirmed that the wafer prepared from example 10 has good quality.

Therefore, it was confirmed that the ingot and the wafer manufactured by applying adhesive layer of seed crystal satisfying the specific Vr value has excellent quality.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An adhesive layer comprising a graphitized adhesive layer,
wherein the graphitized adhesive layer is prepared by heat-treating a pre-carbonized adhesive layer,
wherein the adhesive layer has Vr value of 28%/mm³ or more, and the Vr value is represented by Equation 1 below:

$$Vr = \left\{\frac{Sg}{(V1 - V2)}\right\} \times 10^3 \quad \text{[Equation 1]}$$

where Sg (%) is represented by Equation 2 below, V1 is a volume (mm³) of the pre-carbonized adhesive layer, and V2 is a volume (mm³) of the graphitized adhesive layer, $$Sg = \left\{1 - \left(\frac{A2}{A1}\right)\right\} \times 100\% \quad \text{[Equation 2]}$$

where A1 is an area (mm²) of the pre-carbonized adhesive layer, and A2 is an area (mm²) of the graphitized adhesive layer, and
wherein the adhesive layer has Vg value of 56% or more, and the Vg value is represented by Equation 3 below:

$$Vg = \left\{1 - \left(\frac{V2}{V1}\right)\right\} \times 100\% \quad \text{[Equation 3]}$$

where V1 is a volume (mm³) of the pre-carbonized adhesive layer, and V2 is a volume (mm³) of the graphitized adhesive layer.

2. The adhesive layer of claim 1, wherein the Sg value is 8.5% or more.

3. The adhesive layer of claim 1, wherein the pre-carbonized adhesive layer supports a weight of 1.69 g/cm² or more.

4. The adhesive layer of claim 1, the graphitized adhesive layer supports a weight of 1.97 g/cm² or more.

5. The adhesive layer of claim 1, wherein the pre-carbonized adhesive layer is a coating layer or a film layer having a thickness of 3 μm or more.

6. The adhesive layer of claim 1, comprising at least one selected from the group consisting of an adhesive resin and a filler.

7. The adhesive layer of claim 6, wherein the adhesive resin has an actual carbon ratio of 5 to 50 wt %.

8. The adhesive layer of claim 1, a surface of the pre-carbonized adhesive layer has an area of 7.85×10³ mm² or more, and a surface of the graphitized adhesive layer has an area of 5.50×10³ mm² or more.

* * * * *